United States Patent
Eom et al.

(10) Patent No.: US 8,084,772 B2
(45) Date of Patent: Dec. 27, 2011

(54) ORGANIC LIGHT EMITTING DISPLAY INCLUDING AN AUXILIARY ELECTRODE

(75) Inventors: Ji-Hye Eom, Suwon-si (KR);
Kwang-Sub Shin, Anyang-si (KR);
Young-Il Kim, Suwon-si (KR);
Sun-Min Kim, Seoul (KR); Doo-Hyung Woo, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 52 days.

(21) Appl. No.: 12/424,269

(22) Filed: Apr. 15, 2009

(65) Prior Publication Data

US 2010/0072482 A1 Mar. 25, 2010

(30) Foreign Application Priority Data

Sep. 25, 2008 (KR) .................. 10-2008-0094088

(51) Int. Cl.
*H01L 27/14* (2006.01)
(52) U.S. Cl. .................. 257/72; 257/59; 257/292
(58) Field of Classification Search .................. 257/72, 257/59, 292
See application file for complete search history.

(56) References Cited

U.S. PATENT DOCUMENTS

| 7,663,798 B2 * | 2/2010 | Tonar et al. ............... 359/265 |
| 2005/0218400 A1 * | 10/2005 | Koyama .................... 257/40 |
| 2008/0001533 A1 * | 1/2008 | Kim et al. ................. 313/504 |
| 2008/0001864 A1 * | 1/2008 | Lee et al. .................. 345/82 |

FOREIGN PATENT DOCUMENTS

| JP | 09245964 | | 9/1997 |
| JP | 2007-157374 | * | 6/2007 |
| KR | 1020060001712 | | 1/2006 |
| KR | 1020070021175 | | 2/2007 |

OTHER PUBLICATIONS

Machine translation of JP2007-157374 has been attached.*

* cited by examiner

*Primary Examiner* — Wai Sing Louie
*Assistant Examiner* — Bilkis Jahan
(74) *Attorney, Agent, or Firm* — H.C. Park & Associates, PLC (57) ABSTRACT

Disclosed are an organic light emitting display and a method of manufacturing the same. The organic light emitting includes a first substrate, a first electrode, an organic light emitting layer, and a second electrode. The first substrate includes a pixel region showing an image and a peripheral region surrounding the pixel region. The first electrode is formed in the pixel region of the first substrate. The organic light emitting layer is formed on the first electrode. The second electrode is formed on the organic light emitting layer and extends to the peripheral region. An auxiliary electrode is formed on the second electrode to contact the second electrode on an entire surface of the first substrate, thereby applying a voltage having the same voltage level as that of the second electrode.

16 Claims, 10 Drawing Sheets

ORGANIC LIGHT EMITTING DISPLAY
INCLUDING AN AUXILIARY ELECTRODE

CROSS REFERENCE TO RELATED APPLICATION

This application claims priority from and the benefit of Korean Patent Application No. 2008-94088, filed on Sep. 25, 2008, which is hereby incorporated by reference for all purposes as if fully set forth herein.

BACKGROUND OF THE INVENTION

1. Field of the Invention

The present invention relates to an organic light emitting display. More particularly, the present invention relates to an organic light emitting display that may improve image quality by using an auxiliary electrode.

2. Discussion of the Background

The technical development related to display apparatuses has recently been of interest. Among display apparatuses, an organic light emitting display has attracted attention as a display apparatus to express natural colors.

The organic light emitting display includes a first electrode, a second electrode, and an organic light emitting layer disposed between the first and second electrodes. One of the first and second electrodes, which has a low work function, serves as a cathode, and the other serves as an anode. In the organic light emitting layer, electrons from the cathode are combined with holes from the anode, so that light is emitted. In this case, the cathode or the anode is prepared as a transparent electrode if that electrode is positioned in the direction that light is emitted from the display device.

However, when the cathode or the anode is formed on the entire surface of a display region, the cathode or the anode cannot be thickly formed in order to increase light transmittance or protect the organic light emitting layer. Accordingly, resistance may not be uniform over the entire surface of the above electrode, and a voltage drop may occur due to the non-uniformity of the resistance.

In order to prevent the voltage drop, additional interconnections may be provided below the electrode in which the voltage drop occurs. However, in this case, patterning may be required through an additional photolithography process to form the additional interconnections, so that the manufacturing process becomes complex, and the manufacturing cost may increase.

SUMMARY OF THE INVENTION

The present invention provides an organic light emitting display that may simplify the manufacturing process thereof and enhance the uniformity of an image by forming an auxiliary electrode without an additional photolithography process.

Additional features of the invention will be set forth in the description which follows, and in part will be apparent from the description, or may be learned by practice of the invention.

The present invention discloses an organic light emitting display including a first substrate, a first electrode, an organic light emitting layer, and a second electrode. The first substrate includes a pixel region to display an image, and a peripheral region to surround the pixel region. The first electrode is arranged in the pixel region of the first substrate. The organic light emitting layer is arranged on the first electrode. The second electrode extends to the peripheral region on the organic light emitting layer.

The present invention discloses a method of manufacturing an organic light emitting display, the method including forming a thin film transistor in a pixel region of a first substrate. Thereafter, a common voltage line and an auxiliary line are formed in a peripheral region of the first substrate. A first electrode is formed in the pixel region of the first substrate, the first electrode being connected to the thin film transistor. Then, an organic light emitting layer is formed on the first electrode, and a second electrode is formed on an entire surface of the pixel region to extend to the common voltage line of the peripheral region, the second electrode to being connected to the common voltage line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Hereinafter, the operational principle of an organic light emitting display will be described.

The organic light emitting display is a display apparatus to display an image by interposing an organic light emitting layer between one electrode, which includes a conductive material having a high work function, and the other electrode, which includes a conductive material having a low work function, such that the organic light emitting layer may emit light. In the organic light emitting display, the electrode of the conductive material having a high work function serves as an anode to inject holes to the organic light emitting layer, and the electrode of the conductive material having a low work function serves as a cathode to inject electrons to the organic light emitting layer.

In order for the light to be emitted to the outside of the organic light emitting display, one of the electrodes of the organic light emitting display includes a transparent material that rarely absorbs light in an emission wavelength region.

A principle of emitting light in the organic light emitting display is described below. When the anode having a high work function and the cathode having a low work function inject holes and electrodes to the organic light emitting layer, respectively, excitons are generated in the organic light emitting layer. As the excitons are decayed, light corresponding to an energy difference between lowest unoccupied molecular orbital (LUMO) and highest occupied molecular orbital (HOMO) of the organic light emitting layer is emitted.

Figure 1:
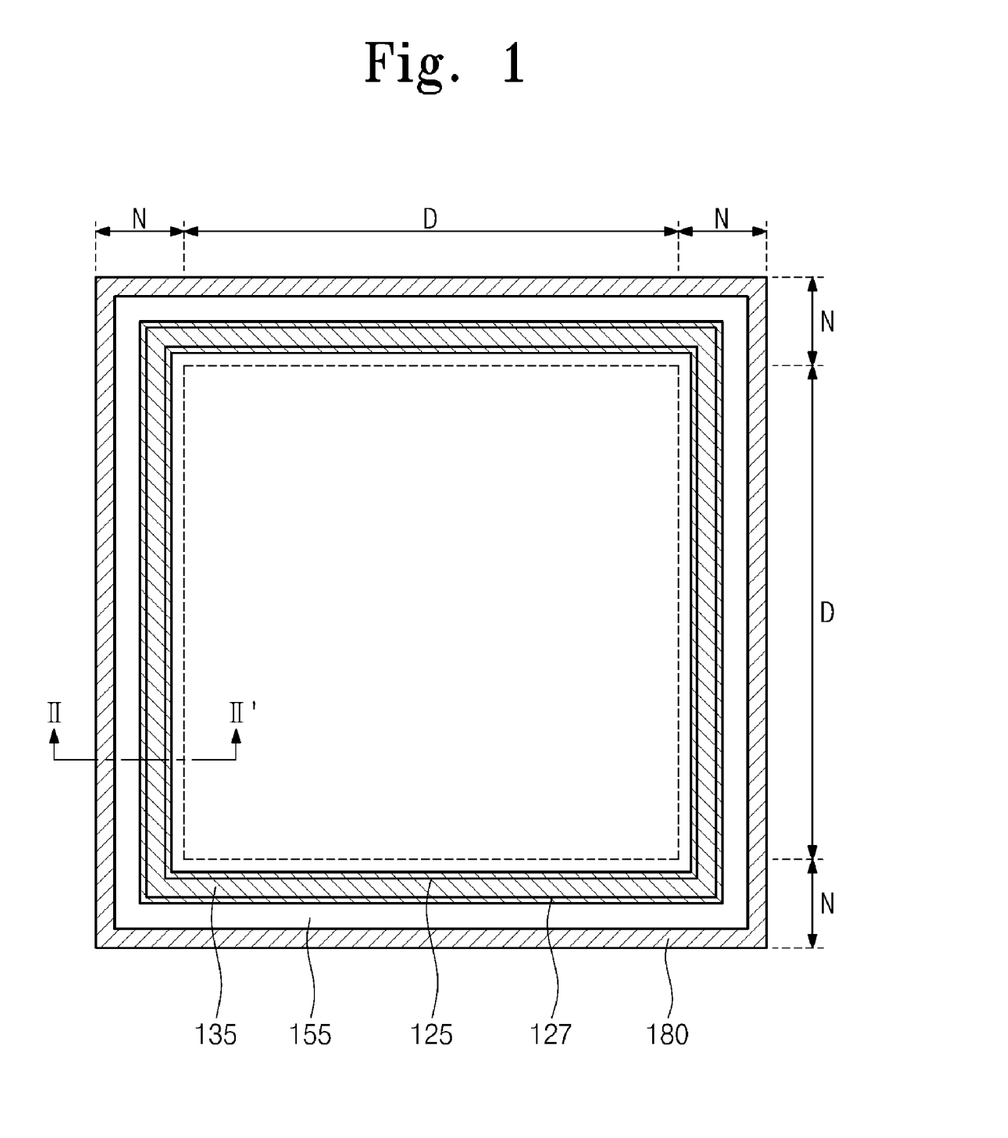
FIG. 1 is a plan view showing an entire surface of an organic light emitting display according to a first exemplary embodiment of the present invention.
Figure 2:
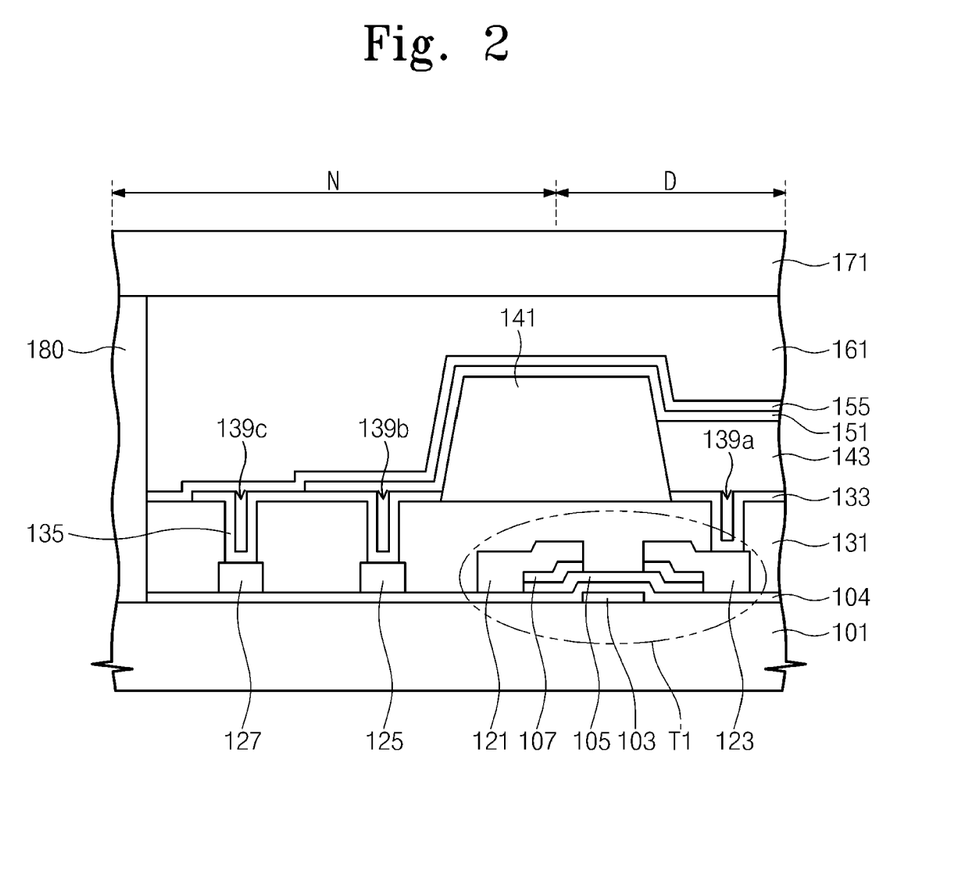
FIG. 2 is a cross sectional view taken along line II-II' of FIG. 1.

FIG. 1 is a plan view showing an entire surface of the organic light emitting display according to a first exemplary embodiment of the present invention, and FIG. 2 is a sectional view taken along line II-II' of FIG. 1. Although the organic light emitting display includes a plurality of gate lines and a plurality of data lines crossing each other to define a plurality of pixels, only one pixel is representatively shown for the purpose of explanation. As shown in FIG. 1 and FIG. 2, a switching thin film transistor is omitted, and only a driving thin film transistor T1 is shown.

Referring to FIG. 1 and FIG. 2, the organic light emitting display according to the first exemplary embodiment of the present invention includes a first substrate 101, the driving thin film transistor T1, which is shown in an oval shape dotted line in FIG. 2 and formed in a pixel region D of the first substrate 101, a first electrode 133 connected to the driving thin film transistor T1, an organic light emitting layer 143 formed on the first electrode 133, and a second electrode 151 formed on the organic light emitting layer 143.

The first substrate 101 and a second substrate 171 have a rectangular plate shape. The first substrate 101 may include insulating materials such as glass, quartz, ceramic, plastic, etc.

The first substrate 101 includes the pixel region D in which an image is displayed and a peripheral region N surrounding the pixel region D. The pixel region D includes pixels. In the peripheral region N, a common voltage line 125 and an auxiliary electrode line 127 are formed. The common voltage line 125 and the auxiliary electrode line 127 are sequentially formed outside the pixel region D while being separated from each other to supply a voltage to the pixel region D. A sealant 180 is formed outside the common voltage line 125 and the auxiliary electrode line 127 along an outer peripheral portion of the second substrate 171 between the first and second substrates 101 and 171 to seal the first and second substrates 101 and 171.

A protective layer 131 is interposed between the driving thin film transistor T1 and the first electrode 133. The first electrode 133 is connected to a drain electrode 123 of the driving thin film transistor T1.

The driving thin film transistor T1 includes a gate electrode 103 formed on the first substrate 101, a gate insulating layer 104 formed on the entire surface of the first substrate 101 having the gate electrode 103, semiconductor layers 105 and 107 formed on the gate insulating layer 104, and source and drain electrodes 121 and 123 spaced apart from each other on the semiconductor layers 105 and 107.

The semiconductor layers 105 and 107 comprise an active layer 105 including amorphous silicon or polycrystalline silicon and an ohmic-contact layer 107 doped with impurities. The active layer 105 and the ohmic-contact layer 107 are overlapped with the gate electrode 103.

The protective layer 131 may include an organic layer or an inorganic layer. The inorganic layer may include silicon oxide ($SiO_2$) or silicon nitride ($SiN_x$), and the organic layer may include one of benzocyclobutene (BCB), olefin, acrylic resin, polyimide, Teflon®, Cytop™, and perfluorocyclobutane.

The first electrode 133, which is connected to the drain electrode 123 of the driving thin film transistor T1, includes metal with low resistance, and, if necessary, may include a transparent conductive material such as indium tin oxide (ITO) or indium zinc oxide (IZO).

A wall 141 is formed on the protective layer 131 around each pixel to surround the first electrode 133. The wall 141 may include a photoresist material (e.g., acrylic resin or polyimide resin) with high heat resistance and high solvent resistance or include an inorganic material such as silicon dioxide ($SiO_2$) or titanium dioxide ($TiO_2$). In addition, the wall 141 may include a double layer of the organic layer and the inorganic layer.

The organic light emitting layer 143, which may include a high molecular weight substance, is formed on the first electrode 133 that is not covered with the wall 141. The organic light emitting layer 143 may include a single layer or multiple-layers. When the organic light emitting layer 143 is formed in multiple-layers, t it may include a hole injecting layer, a light emitting layer, and an electron injecting layer. The organic light emitting layer 143 may further include a hole transfer layer and an electron transfer layer.

The second electrode 151, which includes a conductive material, is formed on the organic light emitting layer 143. According to the present exemplary embodiment, a top-emission type organic light emitting display is used such that light is output away from the first electrode 133 and towards the second electrode 151. Accordingly, the second electrode 151 includes a transparent material so that light emitted from the organic light emitting layer 143 can be transmitted through a top surface of the organic light emitting display. The second electrode 151 may include indium tin oxide, indium zinc oxide, or a transparent metal thin film. Alternatively, the first electrode 133 may include a transparent conductive material or a conductive material that is not transparent.

Although the first and second electrodes 133 and 151 may include various materials, one of the first and second electrodes 133 and 151 including a material having a lower work function serves as a cathode, and the other including a material having a higher work function serves as an anode. Accordingly, holes transferred from the anode are combined with electrons transferred from the cathode to create excitons, thereby emitting light.

The second electrode 151 is formed on the entire surface of the pixel region D and a portion of the peripheral region N so as to be connected with the common voltage line 125 formed in the peripheral region N of the first substrate 101. The common voltage line 125 applies a common voltage to the second electrode 151. The common voltage line 125 may be formed in parallel to a long lateral side or a short lateral side of the pixel region D of the first substrate 101. The common voltage line, if necessary, may be formed along an outer peripheral portion of the pixel region D. The common voltage line 125 may include the same conductive material (e.g., metal) on the same layer as those of the source and drain electrodes 121 and 123 of the driving thin film transistor T1.

Figure 3:
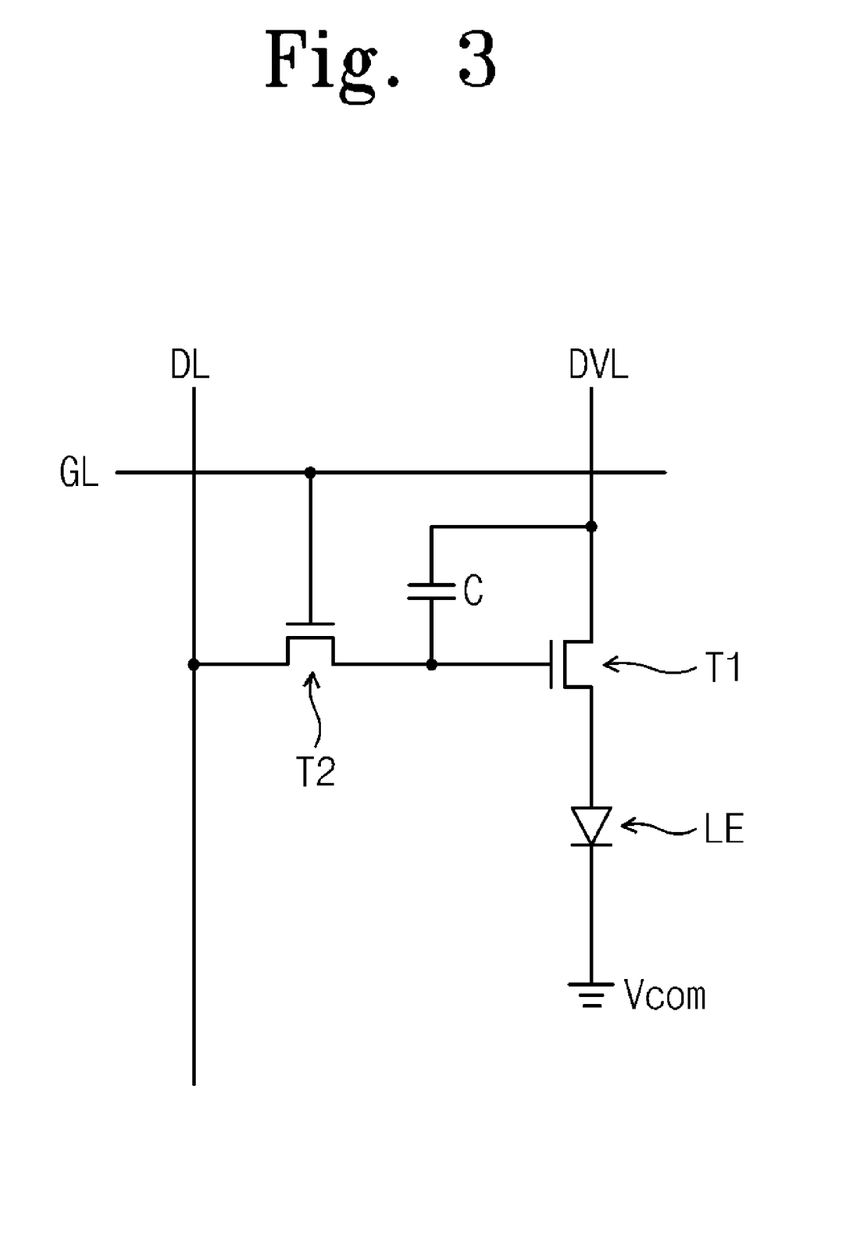
FIG. 3 is an equivalent circuit diagram showing one pixel of the organic light emitting display.

FIG. 3 is an equivalent circuit diagram representing one pixel of the organic light emitting display according to an exemplary embodiment of the present invention having the above structure.

Referring to FIG. 3, in the pixel region D of the first substrate 101, a plurality of gate lines GL extend in one direction and a plurality of data lines DL extending in another direction to cross the gate lines GL, thereby defining pixels. The driving thin film transistor T1 and a second thin film transistor T2 are formed near the crossing area of the gate lines GL and the data lines DL.

A driving voltage line DVL is formed adjacent and parallel to the data line DL. The driving voltage line DVL crosses the gate line GL. The gate line GL transmits a scan signal, and the data line DL transmits a data signal. The driving voltage line DVL supplies a driving voltage to the driving thin film transistor T1.

Each pixel includes the organic light emitting layer 143 (LE), the driving thin film transistor T1 to control holes or electrons applied to the organic light emitting layer 143, the switching thin film transistor T2 to switch the driving thin film transistor T1, and a capacitor C.

The driving thin film transistor T1 includes the gate electrode 103, the source electrode 121, and the drain electrode 123. The gate electrode 103 is connected to the switching thin film transistor T2, and the source electrode 121 is connected to the driving voltage line DVL. The drain electrode 123 is connected to the first electrode 133, which applies a voltage to the organic light emitting layer 143. The organic light emitting layer 143 emits light according to an output signal of the driving thin film transistor T1, thereby displaying an image.

The switching thin film transistor T2 includes a gate electrode, a source electrode, and a drain electrode. The gate electrode is connected to the gate line GL, and the source electrode is connected to the data line DL. The drain electrode is connected to the gate electrode 103 of the driving thin film transistor T1. The switching thin film transistor T2 transmits the data signal applied to the data line DL to the driving thin film transistor T1 according to the scan signal applied to the gate line GL.

The capacitor C is connected between the gate electrode 103 and the source electrode 121 of the driving thin film transistor T1 to charge and maintain the data signal input to the gate electrode 103 of the driving thin film transistor T1.

Referring to FIG. 2, since the second electrode 151 of the organic light emitting display having the above circuit is formed on the entire surface of the pixel region D, a voltage drop may occur in the second electrode 151 where it is formed away from the common voltage line 125.

Such voltage drop occurs since the thickness of the second electrode 151 may be restricted in order to prevent decreased brightness in the top-emission type organic light emitting display, which allows the light from the organic light emitting layer 143 to pass through the second electrode 151. When the thickness of the second electrode 151 is restricted, as the thickness of the second electrode 151 is reduced, resistance of the second electrode 151 is increased.

In the top-emission type organic light emitting display, since the second electrode 151 may include a transparent conductor, metal oxide including indium tin oxide (ITO) or indium zinc oxide (IZO) is typically used. These metal oxides have a higher resistance than metal. In addition, since the second electrode 151 is formed after the organic light emitting layer 143 is formed, a high-temperature process may be difficult to use because of weakness of the light emitting layer. When a voltage is applied to the second electrode 151, since the voltage itself is applied to only an outer portion of the second electrode 151 in the peripheral region N, resistance may be irregular over the entire surface of the second electrode 151.

In order to solve the above problems, according to an exemplary embodiment of the present invention, an auxiliary electrode 155, which applies an additional voltage with the same voltage level as that of the second electrode 151, may be formed on the second electrode 151.

The auxiliary electrode 155 is formed over the entire surface of the peripheral region N and the pixel region D of the first substrate 101 having the second electrode 151, and directly contacts the second electrode 151.

The auxiliary electrode 155 includes a conductive material to apply a voltage with the same voltage level as that of the second electrode 151. The conductive material includes an oxide conductor such as indium tin oxide, indium zinc oxide, tin oxide ($SnO_2$), or zinc oxide doped with aluminum (ZnO: Al). In addition, the auxiliary electrode 155 may include a metal thin film. Although metal of the metal thin film is typically opaque, when the metal is provided as a thin film, the metal can transmit light, and has conductivity. Accordingly, the metal thin film can be used for the auxiliary electrode 155. Further, the auxiliary electrode 155 may include a conductive organic material obtained by doping an organic material with conductive nanoparticles or mixing the organic material with the conductive nanoparticles such as tin oxide ($SnO_2$) nanoparticles.

Although the auxiliary electrode 155 is formed on the entire surface of the second substrate 171 according to the present exemplary embodiment, the auxiliary electrode 155 may comprise a plurality of openings in the second substrate 171. When the auxiliary electrode 155 has the openings, the second electrode 151 may directly make contact with a filler 161. As a contact area of the second electrode 151 and the filler 161 is enlarged, an adhesive strength of an interfacial surface between the second electrode 151 and the filler 161 may be increased.

The auxiliary electrode 155 is electrically connected to the auxiliary electrode line 127. A connection pad 135 is interposed between the auxiliary electrode 155 and the auxiliary electrode line 127 in the peripheral region N. The auxiliary electrode line 127 applies a voltage to the auxiliary electrode 155 through the connection pad 135. The auxiliary electrode line 127 may be formed in parallel to a long lateral side or a short lateral side of the pixel region D of the first substrate 101 at an outer peripheral portion of the common voltage line 125. If necessary, the auxiliary electrode line 127 may be formed along an outer peripheral portion of the pixel region D. The auxiliary electrode line 127 may be formed with a conductive material such as metal on the same layer as those of the source and drain electrodes of the switching thin film transistor T2 or the driving thin film transistor T1, and the common voltage line 125. As shown in FIG. 2, according to the present exemplary embodiment, the auxiliary electrode line 127 is made of the same material and made on the same layer as that of the source and drain electrodes 121 and 123 of the driving thin film transistor T1.

The same voltage level as that of the common voltage line 125 is applied to the auxiliary electrode line 127. Since the auxiliary electrode line 127 helps to maintain uniformly the level of a voltage applied to the second electrode 151 over the whole pixel area, the same voltage level as that of the second electrode 151 is applied to the auxiliary electrode line 127. Accordingly, voltages applied to the auxiliary electrode line 127 and the common voltage line 125 can be supplied from the same voltage source. If necessary, an additional voltage source may be provided, so that voltages having the same level can be applied to the auxiliary electrode line 127 and the common voltage line 125 from different voltage sources.

The protective layer 131, which includes the contact holes 139a, 139b, and 139c to expose portions of the drain electrode 123, the auxiliary electrode line 127, and the common voltage line 125, respectively, is formed on the auxiliary electrode line 127 and the common voltage line 125. The connection pad 135, which is made of the same material disposed on the same layer as that of the first electrode 133, is formed on the protective layer 131. The connection pad 135 simultaneously contacts the auxiliary electrode line 127 and the common voltage line 125 through the contact holes 139c and 139b, respectively.

The connection pad 135 makes contact with the second electrode 151, which extends from the pixel region D, on the common voltage line 125. The connection pad 135 also makes contact with the auxiliary electrode 155, which extends from the pixel region D, on auxiliary electrode line 127. Accordingly, the auxiliary electrode line 127, the common voltage line 125, the second electrode 151, and the auxiliary electrode 155 are electrically connected to each other. The auxiliary electrode line 127, the common voltage line 125, the second electrode 151, and the auxiliary electrode 155 may have the same voltage level.

The connection pad 135 may be prepared in a pad form to simultaneously make contact with the common voltage line 125 and the auxiliary electrode line 127, so that resistance related to a voltage applied to the auxiliary electrode 155 and the second electrode 151 through the auxiliary electrode line 127 and the common voltage line 125 can be reduced.

The second substrate 171 is formed above the auxiliary electrode 155 while facing the first substrate 101. The second substrate 171 includes a transparent insulating material such as glass, quartz, ceramic, or plastic.

The filler 161 is interposed between the first and second substrates 101 and 171. The filler 161 is filled in an empty space between the auxiliary electrode 155 and the second substrate 171.

The filler 161 may include various materials. However, the filler 161 preferably includes a curable organic polymer. The organic polymer may be formed in the space between the first and second substrates 101 and 171 and then cured by light or heat to form the filler 161. The filler 161 may be used to maintain the distance between the first and second substrates 101 and 171 and protect components formed on the first substrate 101.

The sealant 180 is formed at the outermost portion of the peripheral region N of the first and second substrates 101 and 171. The sealant 180 seals the first and second substrates 101 and 171 to protect components formed between the first and second substrates 101 and 171. Although the sealant 180 includes an insulating material, the sealant 180 may include a conductive material if necessary. A case in which the sealant 180 includes the conductive material will be described below according to another exemplary embodiment.

In the organic light emitting display according to an exemplary embodiment of the present invention, the auxiliary electrode 155 supplements a voltage applied to the second electrode 151 to improve the resistance uniformity of the second electrode 151, and reduce the whole resistance of the second electrode 151. Accordingly, the voltage drop of the second electrode 151 may be reduced. In addition, the thickness of the auxiliary electrode 155 may be controlled to adjust an amount of light passing through the auxiliary electrode 155 and the second electrode 151, so that optical characteristics of the organic light emitting display may be controlled.

Hereinafter, a method of manufacturing the organic light emitting display according to an exemplary embodiment of the present invention will be described with reference to FIG. 4A, FIG. 4B, FIG. 4C, FIG. 4D, FIG. 4E, FIG. 4F, FIG. 4G, FIG. 4H, and FIG. 4I. The organic light emitting display including the driving thin film transistor T1 will be described with reference to FIG. 4A, FIG. 4B, FIG. 4C, FIG. 4D, FIG. 4E, FIG. 4F, FIG. 4G, FIG. 4H, and FIG. 4I.

Figure 4A:
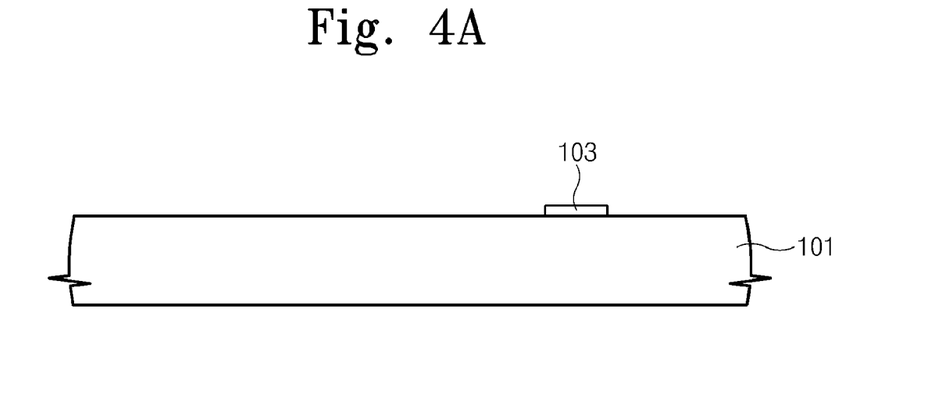
FIG. 4A, FIG. 4B, FIG. 4C, FIG. 4D, FIG. 4E, FIG. 4F, FIG. 4G, FIG. 4H, and FIG. 4I are sectional views showing a method of manufacturing an organic light emitting display according to a first exemplary embodiment of the present invention.

First, as shown in FIG. 4A, the first substrate 101 is prepared, and the gate electrode 103 and the gate line (not shown) are formed on the first substrate 101.

The first substrate 101 may include an insulating material such as glass, quartz, ceramic, or plastic. The first substrate 101 may include a flexible substrate including plastic. In addition, the first substrate 101 may include polyethersulfone or fiber enforced plastic.

The gate electrode 103 and the gate line may be formed by depositing a first conductive material on the entire surface of the first substrate 101 and patterning the first conductive material through a photolithography process.

Figure 4B:
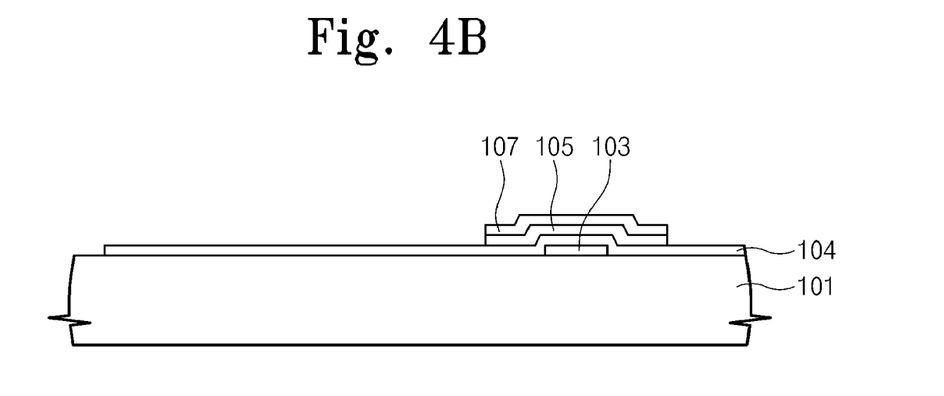

Next, as shown in FIG. 4B, after forming the gate electrode, the gate insulating layer 104, an amorphous silicon layer, and an N+ amorphous silicon layer are sequentially deposited. The N+ amorphous silicon layer is obtained by doping the amorphous silicon layer with impurities, on the entire surface of the first substrate 101 having the gate electrode 103 and the gate line. Then, the amorphous silicon layer and the N+ amorphous silicon layer are selectively patterned through a photolithography process, thereby forming the ohmic contact layer 107 allowing the active layer 105 and the source and drain electrodes 121 and 123 to make ohmic-contact with each other. The gate insulating layer 104 may include an insulating material such as silicon nitride ($SiN_x$) or silicon oxide ($SiO_2$).

Figure 4C:
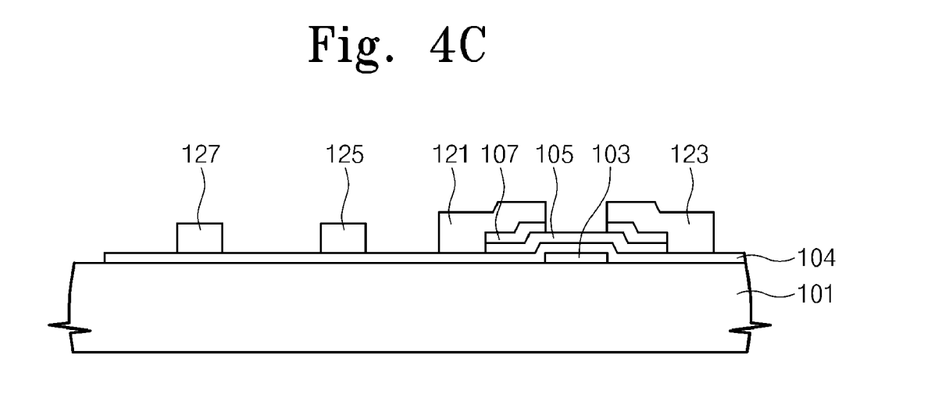

Thereafter, as shown in FIG. 4C, after depositing a second conductive layer on the entire surface of the first substrate 101 having the active layer 105 and the ohmic-contact layer 107, the second conductive layer is selectively patterned through a photolithography process, thereby forming the source and drain electrodes 121 and 123 in the pixel region D and forming the common voltage line 125 and the auxiliary electrode line 127 in the peripheral region N.

Figure 4D:
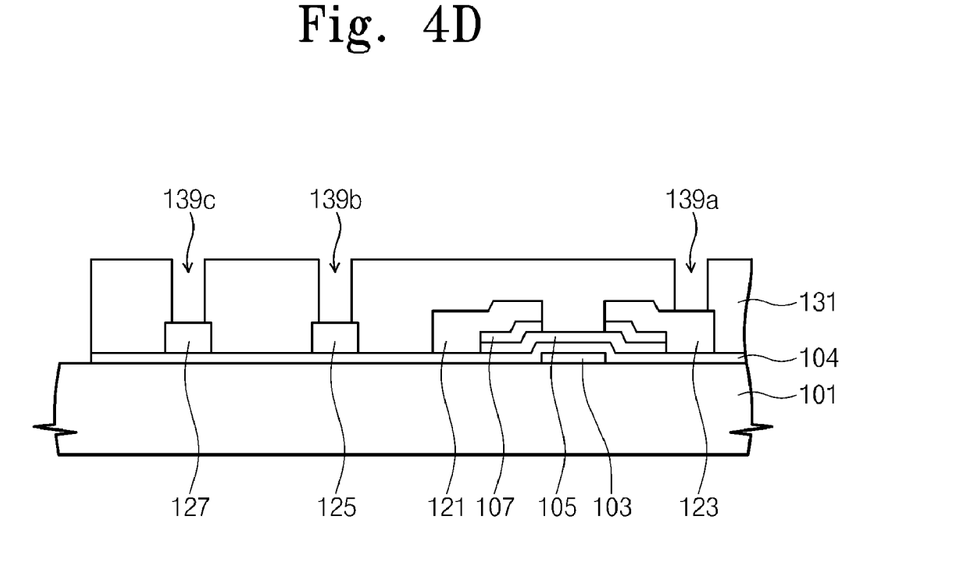

Then, as shown in FIG. 4D, the protective layer 131 is formed on the first substrate 101 having the source and drain electrodes 121 and 123, the common voltage line 125, and the auxiliary electrode line 127. The protective layer 131 may include an organic layer or an inorganic layer. The inorganic layer may include silicon oxide ($SiO_2$) or silicon nitride (SiNx), and the organic layer may include one of benzocyclobutene (BCB), olefin, acrylic resin, polyimide, Teflon®, Cytop™, and perfluorocyclobutane.

Subsequently, a portion of the protective layer 131 is removed though a photolithography process, thereby forming a first contact hole 139a exposing a portion of the drain electrode 123 in the pixel region D, a second contact hole 139b exposing a portion of the common voltage line 125, and a third contact hole 139c exposing a portion of the auxiliary electrode line 127 in the peripheral region N.

Figure 4E:
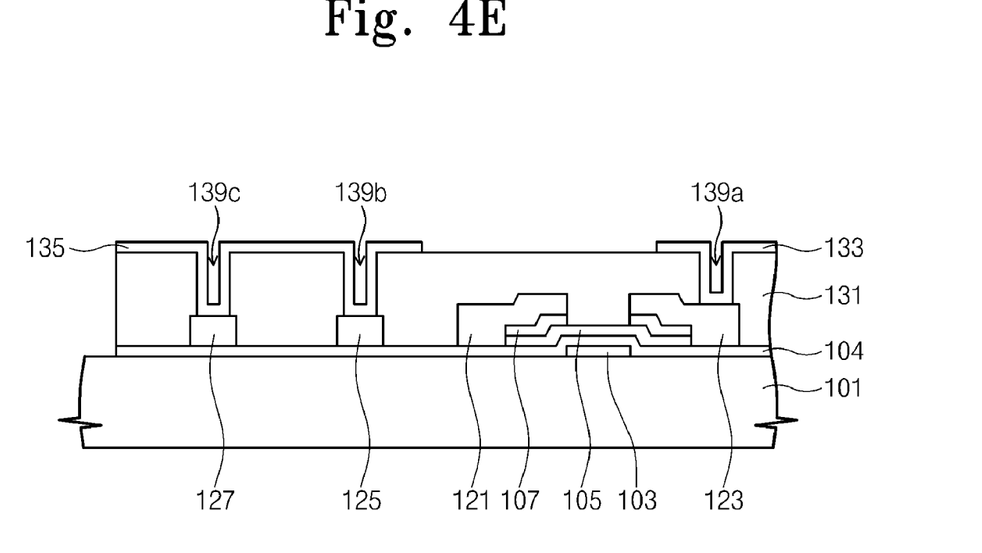

Thereafter, as shown in FIG. 4E, after depositing a transparent third conductive layer on the entire surface of the first substrate 101 having the protective layer 131, the third conductive layer is selectively patterned through a photolithography process, thereby forming the first electrode 133 electrically connected to the drain electrode 123 through the first contact hole 139a in the pixel region D, and the connection pad 135 electrically connected to the common voltage line 125 and the auxiliary electrode line 127 through the second and third contact holes 139b and 139c in the peripheral region N. The first electrode 133 and the connection pad 135 may be formed by depositing transparent conductive materials such as indium tin oxide or indium zinc oxide.

Figure 4F:
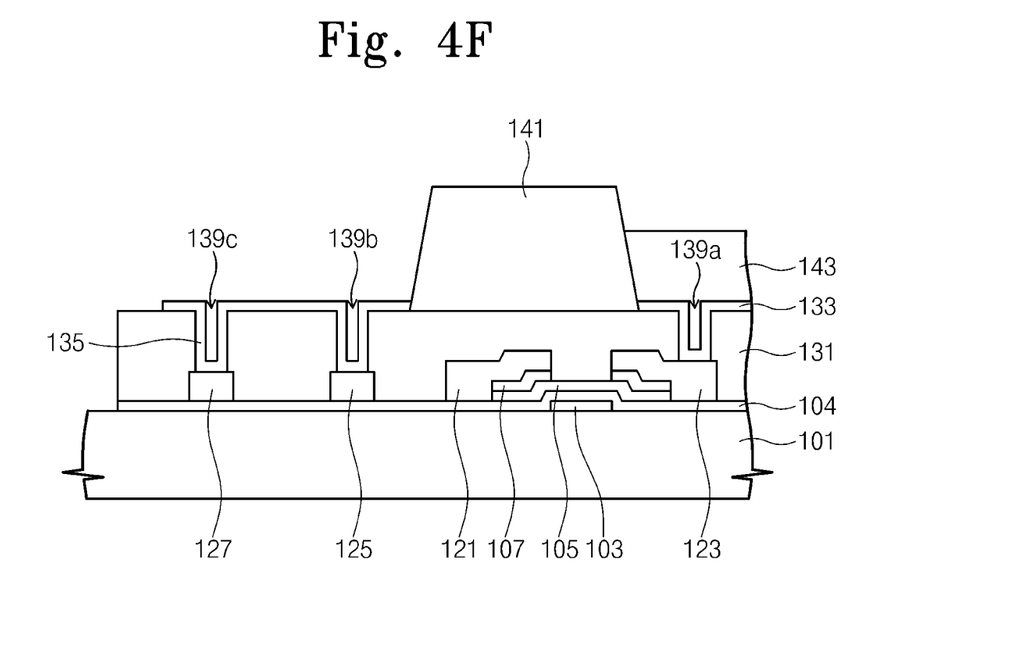

Then, as shown in FIG. 4F, the wall 141 is formed to surround the first electrode 133 along the outer peripheral portion of each pixel in the pixel region D of the first substrate 101 having the first electrode 133 and the connection pad 135. The organic light emitting layer 143 is then formed in each pixel. The wall 141 may be formed by depositing a photoresist material (e.g., acrylic resin or polyimide resin) having high heat resistance and high solvent resistance on the first substrate 101 and patterning the photoresist material through a photolithography process. In addition, the wall 141 may be formed by depositing an inorganic material such as silicon dioxide ($SiO_2$) or titanium dioxide ($TiO_2$) and patterning the inorganic material through a photolithography process. Also, the wall 141 may include a double layer of an organic layer and an inorganic layer.

The organic light emitting layer 143 may be formed by performing various schemes such as an ink-jetting scheme, a depositing scheme, and a printing scheme with respect to an organic light emitting material supplied in the pixel surrounded by the wall 141. For example, the organic light emitting layer 143 may be formed by dropping ink by ink-jetting scheme on a part of the pixel not covered with the wall 141 and drying the ink. In addition, the organic light emitting layer 143 may have a single layer. Alternatively, the organic light emitting layer 143 may have a double layer of a hole injecting layer and a light emitting layer. When the organic light emitting layer 143 includes the double layer of the hole injecting layer and the light emitting layer, the mixture of polythiophene derivatives of poly(3,4-ethylenedioxythiophene) (PEDOT) and poly (4-styrenesulfonate) PSS and a polar solution, in which the mixture is dissolved, are applied onto the pixel to form the hole injecting layer, and a luminescence solution which is a polymer solution including a light emitting material, is applied onto the hole injecting layer.

Figure 4G:
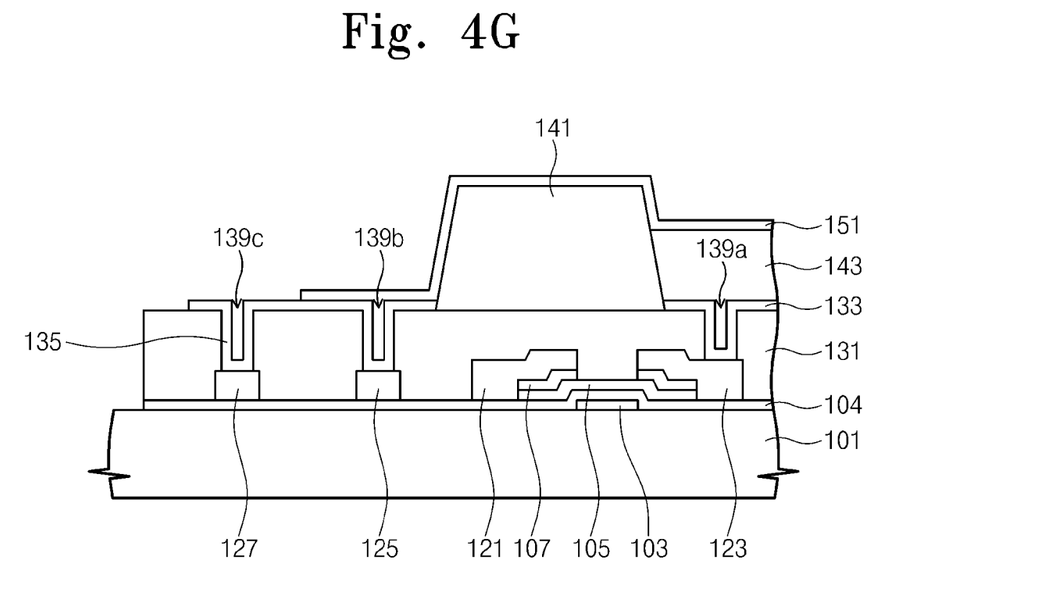

Thereafter, as shown in FIG. 4G, a fourth conductive layer is deposited on the first substrate 101 having the wall 141 and the organic light emitting layer 143 and patterned through a photolithography process, thereby forming the second electrode 151. The second electrode 151 is formed not only in display region D but also in a portion of the peripheral region N, that is, an upper portion of the common voltage line 125 such that the second electrode 151 can be connected to the common voltage line 125 through the connection pad 135 and the second contact hole 139b. The second electrode 151 includes a transparent conductive material such as indium tin oxide or indium zinc oxide.

Figure 4H:
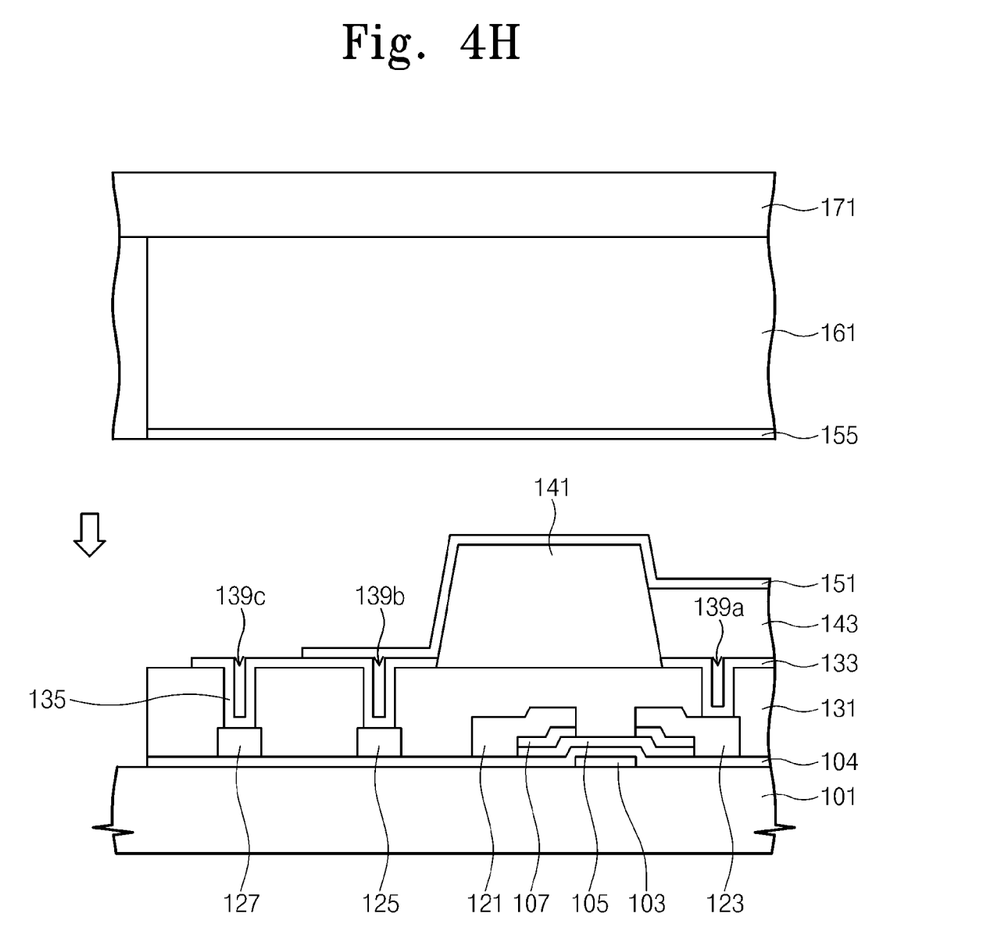

Subsequently, as shown in FIG. 4H, after positioning the second substrate 171 on the first substrate 101 having the second electrode 151 in opposition to the first substrate 101, the first and second substrates 101 and 171 are coupled to face each other. Although not shown in drawings, preparing the second substrate 171 will be described below.

First, the second substrate 171 includes an insulating material such as glass, quartz, or plastic. The second substrate 171 may include the same material as that of the first substrate 101.

Next, the filler 161 is formed on the entire surface of the second substrate 171. The filler 161 may be formed through various schemes such as a spin-coating scheme and a printing scheme. The filler 161 fills in a space between the first and second substrates 101 and 171. The type of the filler 161 is not limited. The filler 161 may include an organic polymer that may be cured by applying heat or light thereto. As the organic polymer may have mobility or softness, the organic polymer may be filled in the space between the first and second substrates 101 and 171 without forming a gap due to the mobility of the organic polymer during a process of coupling the first and second substrates 101 and 171.

A fifth conductive layer is formed on the second substrate 171 having the filler 161. The fifth conductive layer is formed as a thin film.

The fifth conductive layer becomes the auxiliary electrode 155. The fifth conductive layer may be an oxide conductor such as indium tin oxide, indium zinc oxide, tin oxide, or zinc oxide doped with aluminum. The fifth conductive layer may include a metal thin film. Although metal of the metal film is opaque, the thin film having a thickness equal to or less than a predetermined thickness is transparent. Accordingly, the metal thin film can be used for the auxiliary electrode 155. The fifth conductive layer may include a material obtained by doping an organic material with conductive nanoparticles or mixing the organic material with the conductive nanoparticles such as $SnO_2$ nanoparticles.

A scheme of forming a thin film on the second substrate 171 using the above materials is not limited, and the scheme includes an evaporation scheme, a dipping scheme, or a spin coating scheme.

For example, oxide such as indium tin oxide, indium zinc oxide, tin oxide, or zinc oxide doped with aluminum, or a metal thin film may be formed through the evaporation scheme or a sol-gel scheme.

Further, the present invention may employ a sol-gel scheme of performing hydrolysis and polycondensation with respect to a compound in a solution to form a gel, using an inorganic compound of metal as a start material, and heating the gel to obtain a result. The present invention also may employ a lamination scheme of separately fabricating a conductive thin film and bonding the conductive thin film on the filler 161 to place the conductive thin film on the surface of the filler 161.

The auxiliary electrode 155 may have a plurality of openings. Accordingly, to form the auxiliary electrode 155 having the openings, an evaporation process may be performed with respect to the second substrate 171 by using a patterned mask. Or, a conductive thin film having an opening pattern may be separately fabricated and make contact with the filler 161 of the second substrate 171, so that an upper portion of the filler 161 is laminated. Further, the surface of the filler 161 may be treated by using a specific material, for example, hydrophobic material, such that the filler 161 can have a shape corresponding to an opening pattern, and then a conductive layer may be formed on the filler 161. Besides, after depositing a conductive material by using heat or electronic beam, a photolithography process may be performed over the resultant structure to pattern openings.

Since deposition or coating process to form the auxiliary electrode 155 is performed with respect to the second substrate 171 instead of the first substrate 101 having the organic light emitting layer 143, the manufacturing process can be performed freely from the temperature restriction. If the auxiliary electrode 155 is formed on the first substrate 101 having the organic light emitting layer 143, the manufacturing process must be performed at a temperature equal to or less than a predetermined temperature to minimize a influence on the organic light emitting layer 143. However, according to an exemplary embodiment of the present invention, since the auxiliary electrode 155 is formed on the second substrate 171, the manufacturing process can be freely performed without restriction.

The sealant 180 is formed at the outermost peripheral portion of the second substrate 171. The sealant 180 may be formed on the first substrate 101 or the second substrate 171, and the sequence of forming the sealant 180 and the filler 161 may be changed. In other words, the filler 161 may be formed after or before the sealant 180 is formed. According to the present embodiment, the sealant 180 is formed on the second substrate 171.

The second substrate 171 is arranged in opposition to the first substrate 101, and coupled to the first substrate 101. As the second substrate 171 is coupled to the first substrate 101, the auxiliary electrode 155 makes contact with the second electrode 151 and the connection pad 135. The filler 161 interposed between the first and second substrates 101 and 171, which are coupled, may be cured by applying light or heat if necessary.

Figure 4I:
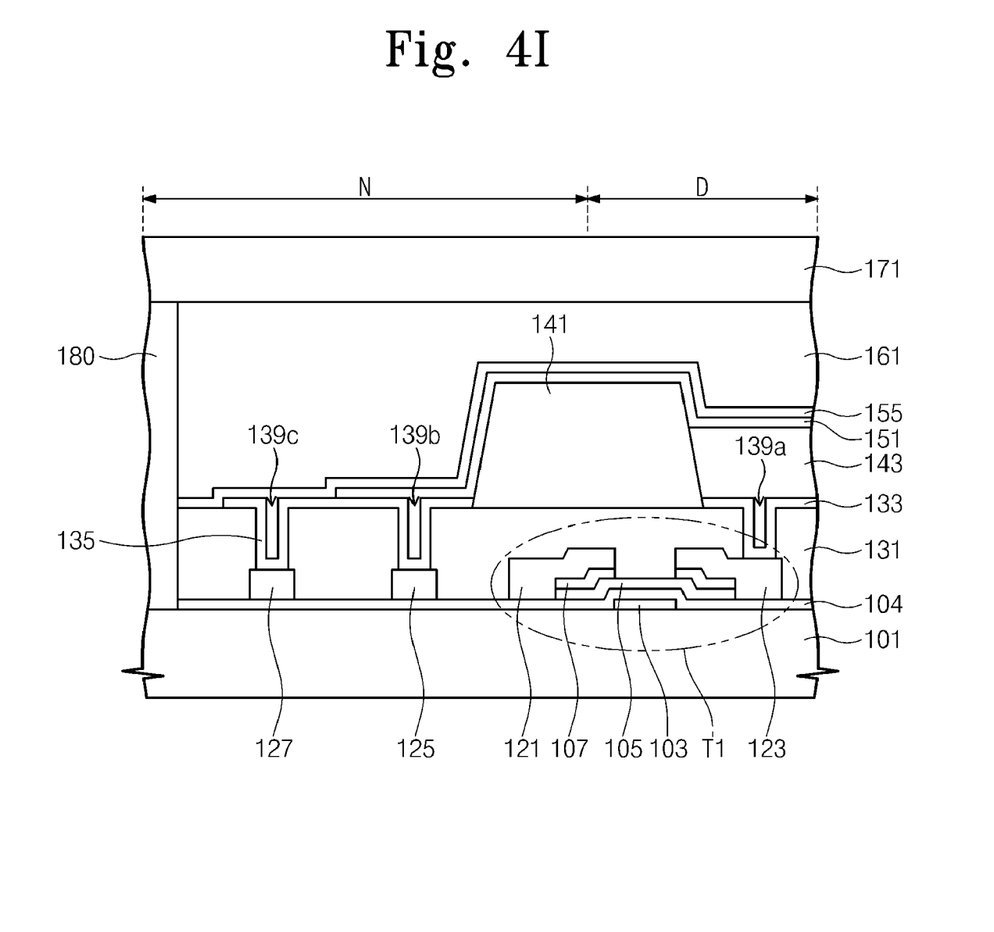

As described above, according to the first exemplary embodiment of the present invention, the auxiliary electrode 155 is formed on the second substrate 171 instead of the first substrate 101, and the first and second substrates 101 and 171 are coupled to each other, thereby forming the organic light emitting display shown in FIG. 4I through a simple manufacturing process.

Although the first exemplary embodiment of the present invention has been described above, those skilled in the art can change or modify the present embodiment without departing from the spirit or principle of the present invention.

For example, according to another exemplary embodiment of the present invention, the auxiliary electrode line 127 may be divided into a plurality of lines.

Figure 5:
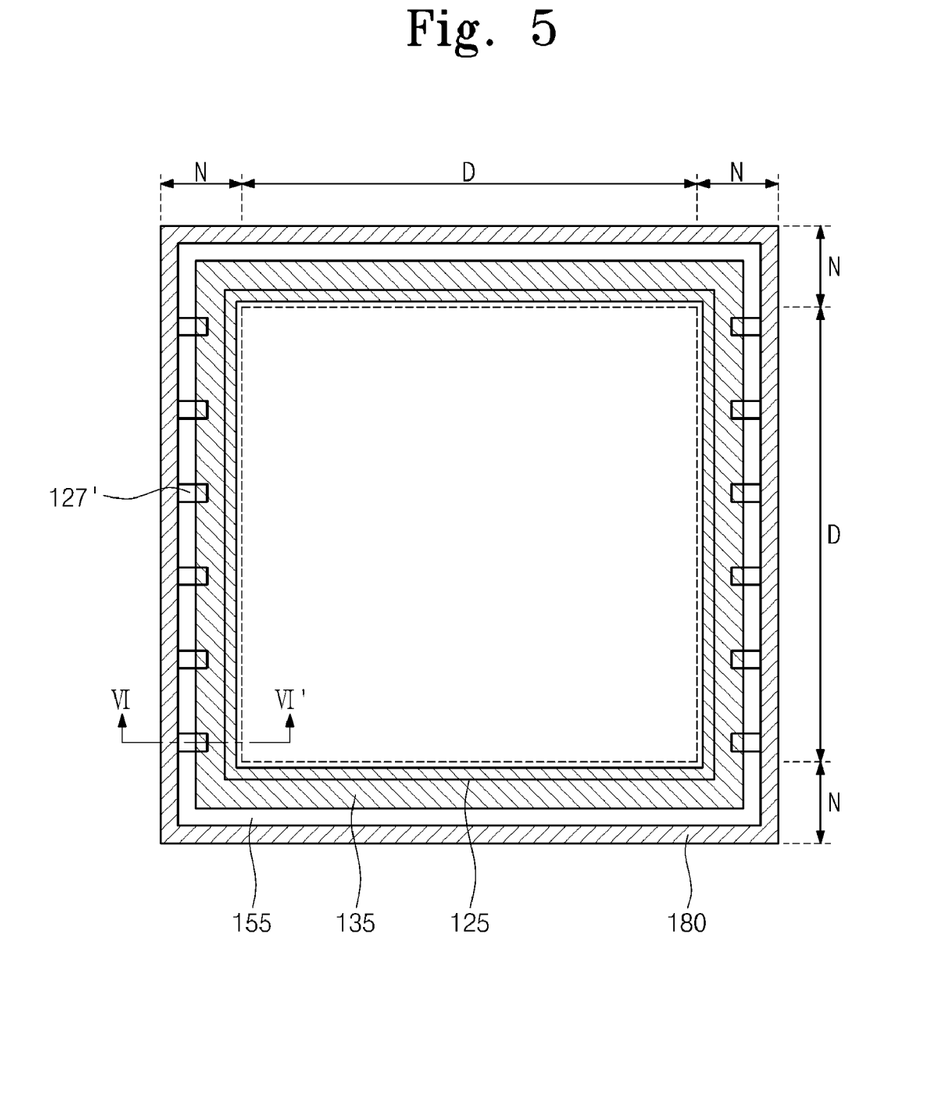
FIG. 5 is a plan view showing an entire surface of an organic light emitting display according to a second exemplary embodiment of the present invention.
Figure 6:
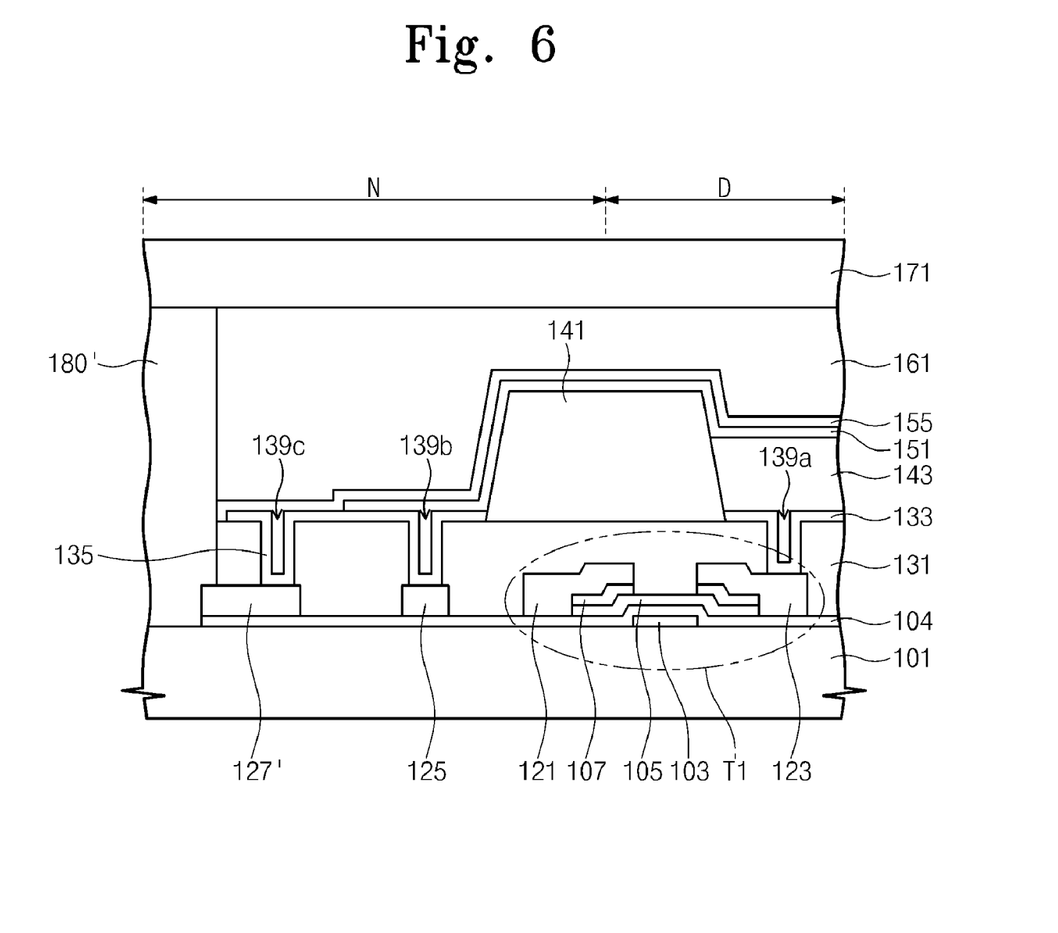
FIG. 6 is a cross sectional view taken along line VI-VI' of FIG. 5.

FIG. 5 is a plan view showing an entire surface of an organic light emitting display according to a second exemplary embodiment of the present invention, and FIG. 6 is a sectional view taken along line VI-VI' of FIG. 5. According to the present exemplary embodiment, only a portion different from the first exemplary embodiment will be described. For the purpose of explanation, the same reference numerals will be assigned to elements identical to the first exemplary embodiment.

Referring to FIG. 5 and FIG. 6, according to the present exemplary embodiment, a plurality of auxiliary electrode lines 127' are formed at an outer peripheral portion of the common voltage line 125 used to apply a voltage to the second electrode 151. The auxiliary electrode lines 127' are spaced apart from each other. The auxiliary electrode lines are formed in a portion of the peripheral region N. If a voltage is applied to the auxiliary electrode 155 through the auxiliary electrode lines 127', the position or the number of the auxiliary electrode lines 127' is not limited. If necessary, the position or the number of the auxiliary electrode lines 127' may be adjusted.

Each auxiliary electrode line 127' is extended in perpendicular to an extension direction of the common voltage line 125. One end of the auxiliary electrode line 127' toward the common voltage line 125 contacts the connection pad 135 to be electrically connected to the auxiliary electrode 155. In addition, the other end of the auxiliary electrode line 127' connects to a sealant 180'. In more detail, a predetermined portion of the other end of the auxiliary electrode line 127' overlaps with and contacts the sealant 180'.

In this case, the sealant 180' includes a conductive material, and a voltage having the same voltage level as that of the second electrode 151 is applied to the sealant 180', thereby maintaining a voltage of the auxiliary electrode 155 to a predetermined voltage level.

According to the present exemplary embodiment, a power applying region of the auxiliary electrode line 127' is not separately provided outside the sealant 180' to directly apply a voltage to the sealant 180'.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display, comprising:
   a first substrate comprising a pixel region to display an image and a peripheral region surrounding the pixel region;
   a first electrode arranged in the pixel region;
   an organic light emitting layer arranged on the first electrode;
   a second electrode arranged on the organic light emitting layer, the second electrode extending to the peripheral region;
   a common voltage line arranged in the peripheral region of the first substrate, the common voltage line being connected to the second electrode to apply a voltage to the second electrode;
   an auxiliary electrode arranged on the second electrode and connected to the second electrode, the auxiliary electrode being connected to the common voltage line in the peripheral region of the first substrate; and
   an auxiliary electrode line arranged in the peripheral region of the first substrate, the auxiliary electrode line being connected to the auxiliary electrode to apply a voltage to the auxiliary electrode,
   wherein the common voltage line and the auxiliary electrode line are arranged directly on the same layer.

2. The organic light emitting display of claim 1, wherein the auxiliary electrode line and the common voltage line have the same level of applied voltage.

3. The organic light emitting display of claim 1, wherein the common voltage line and the auxiliary electrode line are connected to one voltage source.

4. The organic light emitting display of claim 1, wherein the auxiliary electrode comprises a plurality of opening patterns.

5. The organic light emitting display of claim 1, wherein the auxiliary electrode comprises an oxide conductor.

6. The organic light emitting display of claim 5, wherein the oxide conductor comprises one of indium tin oxide, tin oxide, and zinc oxide doped with aluminum.

7. The organic light emitting display of claim 1, wherein the auxiliary electrode is a metal thin film.

8. The organic light emitting display of claim 1, wherein the auxiliary electrode comprises a conductive organic material.

9. The organic light emitting display of claim 1, further comprising:
   a filler arranged on the auxiliary electrode; and
   a second substrate arranged on the filler.

10. The organic light emitting display of claim 9, further comprising a sealant, the sealant disposed between the first and second substrates.

11. The organic light emitting display of claim 10, wherein the sealant comprises a conductive material, and a portion of the auxiliary electrode line contacts the sealant.

12. The organic light emitting display of claim 11, wherein the pixel region is surrounded by the auxiliary electrode line along the sealant.

13. The organic light emitting display of claim 11, wherein the auxiliary electrode line is divided into a plurality of lines.

14. The organic light emitting display of claim 1, further comprising a connection pad arranged on the common voltage line and the auxiliary electrode line, the connection pad contacting the second electrode and the auxiliary electrode.

15. The organic light emitting display of claim 1, further comprising a thin film transistor arranged on the first substrate, the thin film transistor comprising:
a gate electrode arranged on the first substrate;
a gate insulating layer arranged on the gate electrode;
a semiconductor layer arranged on the gate insulating layer; and
a source electrode and a drain electrode separated from the source electrode, the source electrode and the drain electrode being arranged on the semiconductor layer, and the drain electrode being connected to the first electrode.

16. The organic light emitting display of claim 15, wherein the common voltage line and the auxiliary electrode line are arranged directly on the same layer as the source electrode and the drain electrode.

* * * * *